United States Patent
Lee et al.

[11] Patent Number: 6,110,793
[45] Date of Patent: Aug. 29, 2000

[54] METHOD FOR MAKING A TRENCH ISOLATION HAVING A CONFORMAL LINER OXIDE AND TOP AND BOTTOM ROUNDED CORNERS FOR INTEGRATED CIRCUITS

[75] Inventors: Kuei-Ying Lee, Chu-Tung; Kong-Beng Thei, Suang-Shi; Bou-Fun Chen, Taipei, all of Taiwan

[73] Assignee: Taiwan Semiconductor Manufacturing Company, Hsin-Chu, Taiwan

[21] Appl. No.: 09/104,033

[22] Filed: Jun. 24, 1998

[51] Int. Cl.$^7$ .................................................. H01L 21/76
[52] U.S. Cl. ........................... 438/400; 438/410; 437/67; 437/72
[58] Field of Search ..................... 438/400, 410; 437/67, 72

[56] References Cited

U.S. PATENT DOCUMENTS

| | | | |
|---|---|---|---|
| 5,068,202 | 11/1991 | Crotti et al. | 437/67 |
| 5,258,332 | 11/1993 | Horioka et al. | 437/228 |
| 5,445,989 | 8/1995 | Lur et al. | 437/67 |
| 5,470,783 | 11/1995 | Chiu et al. | 437/72 |
| 5,578,518 | 11/1996 | Koike et al. | 437/67 |
| 5,861,104 | 1/1999 | Omid-Zohoor | 216/84 |

*Primary Examiner*—David Nelms
*Assistant Examiner*—Pho Luu
*Attorney, Agent, or Firm*—George O. Saile; Stephen B. Ackerman

[57] ABSTRACT

A method for forming an improved trench isolation having a conformal liner oxide and rounded top and bottom corners in the trench was achieved. The conformal liner oxide improves the CVD gap-filling capabilities for these deep submicron wide trenches, and the rounded corners improve the electrical characteristics of the devices in the adjacent device areas. After etching trenches with vertical sidewalls in the silicon substrate, a two-step oxidation process is used to form the conformal liner oxide. A first oxidation step using a low-oxygen flow rate and a low temperature (about 850 to 920° C.) is used to achieve rounded bottom corners. A second oxidation step at a low-oxygen flow rate and a higher temperature (about 1000 to 1150° C.) is used to achieve rounded top corners. The two-step process also results in a more conformal liner oxide. The trenches are then filled with a CVD oxide and polished or etched back to an oxidation-barrier layer/etch-stop layer over the device areas to complete the trench isolation.

20 Claims, 2 Drawing Sheets

METHOD FOR MAKING A TRENCH ISOLATION HAVING A CONFORMAL LINER OXIDE AND TOP AND BOTTOM ROUNDED CORNERS FOR INTEGRATED CIRCUITS

BACKGROUND OF THE INVENTION (1) Field of the Invention

The present invention relates in general to the fabrication of semiconductor devices for integrated circuits, and more particularly to a method for forming a trench isolation having conformal top and bottom round trench liner oxides. This provides improved gap filling with chemical vapor deposited (CVD) oxides and the rounded top and bottom corners reduce the junction leakage for devices, such as field effect transistors (FETs).

(2) Description of the Prior Art

In fabricating semiconductor circuits, field oxide (FOX) regions are formed in and on the silicon substrate to surround and electrically isolate the device areas. One of the most common and cost-effective methods of forming this field oxide isolation in the semiconductor industry is by the LOCal Oxidation of Silicon (LOCOS) technique. In the LOCOS technique a patterned silicon nitride layer is used on the silicon substrate as a barrier mask to oxidation. The substrate is then oxidized to form the FOX regions. However, the LOCOS technique has several problems as the device feature sizes decrease and the circuit density increases. One problem is that the lateral oxidation of the silicon substrate under the silicon nitride mask forms what are commonly referred to in the industry as "birds+ beaks."These birds' beaks extend into and reduce the active device areas. This limits the device packing density on the chip. As minimum feature sizes on the substrate continue to decrease, it will become increasingly difficult to increase the integrated circuit density.

One method of overcoming these LOCOS limitations is to use trench isolation techniques. In this method trenches less than 0.5 micrometers (um) in width are etched in the substrate while the silicon nitride ($Si_3N_4$) is left over the device areas. A sacrificial oxide is thermally grown to remove any substrate damage due to the plasma etching of the trenches, and a relatively thin liner oxide is grown to provide a good interface. The trenches are then filled by depositing a silicon oxide ($SiO_2$), such as by subatmospheric chemical vapor deposition (SA-CVD). The SACVD oxide is then etched back or chemical/mechanically polished back to the $Si_3N_4$ layer to complete the trench isolation. Unfortunately, the trench isolation has several limitations. For example, the sharp corners at the bottom of the trenches can result in high stress that can cause lattice defects in the single-crystal silicon substrate during liner oxidation and gap filling. Another problem is that sharp corners at the top of the trench can result in junction leakage currents, more specifically, can result in unwanted increases in the sub-threshold currents in the channel regions along the edge of the device areas when the FETs are switched on. The device threshold voltage can also be lowered. Therefore it is desirable to form trenches having rounded top corners to increase the radius of curvature and decrease the electric field at the top corners.

One method of forming the liner oxide is to thermally oxidize the trench using a high flow rate of $O_2$ and a relatively low temperature of 920° degrees centigrade (°C.) followed by a second high flow rate of $O_2$ at 920° C. Although this provides rounded top and bottom corners, the profile is not conformal around the trench wall and a thicker overhead profile makes it difficult to SA-CVD oxide gap filling of the trenches. Another approach is to form the liner oxide using a wet liner oxidation at even lower temperatures of about 850° C. and at high $O_2$ flow rates. Although the process eliminates the overhead profile and provides rounded bottom corners, the top corners are sharp and there is a thicker oxide on the trench sidewalls.

Other methods of forming trench isolation have been described in the literature. For example, Koike et al. in U.S. Pat. No. 5,578,518, describes a method for forming rounded top corners in the trench. The method involves recessing a thermally grown oxide around the top edge of the trench to expose the top corners before grown a liner oxide. Then the liner oxide is grown resulting in more rounded top corners. Another method for forming trenches with rounded corners is described by Horioka et al. in U.S. Pat. No. 5,258,332 in which the oxide mask at the edge of the trench is recessed in a hydrofluoric acid etch. Then the exposed silicon edges of the trench are subjected to a $CF_4/O_2$ in a down-flow type etching apparatus, commonly referred to as a chemical dry etching (CDE) apparatus to round the top corners of the silicon trench. Crotti et al., U.S. Pat. No. 5,068,202, teach a method for forming rounded trenches for implanting in the sidewalls without reverting to special implant techniques. The trenches are subjected to a $CF_4/O_2$ plasma etching in a down-stream etcher to round the trench.

However, none of the above references addresses the concerns of growing a conformal liner oxide in a sub-micron trench, while providing both rounded top and bottom corners. Therefore there is still a need for an improved liner oxide process.

SUMMARY OF THE INVENTION

It is a principal object of this invention to provide conformal liner oxides for trench isolation that have trenches with top and bottom rounded corners for improved trench filling and reduced leakage currents.

In summary, the method of forming the trench isolation structure with rounded top and bottom corners begins by providing a single-crystal silicon substrate. A pad oxide layer, such as a thermal silicon oxide, is formed on the surface of the silicon substrate to provide a stress-release layer. An oxidation barrier layer, preferably silicon nitride, is deposited on the pad oxide layer. The silicon nitride layer and the pad oxide layer are patterned using a photoresist mask and anisotropic plasma etching to leave portions over the device areas to prevent oxidation, while providing openings in the silicon nitride over the areas surrounding the device areas where the trench isolation is required. The trenches are then etched in the silicon substrate in the open areas of the oxidation barrier layer. The trenches are anisotropically etched to provide vertical sidewalls. The photoresist mask is removed using, for example, plasma ashing in oxygen ($O_2$). Now by the method of this invention, a two-step thermal oxidation process is carried out to form a conformal liner oxide in the trenches, while providing rounded top and bottom corners in the trenches. The first thermal oxidation step is done using oxygen ($O_2$) at a low flow rate and at a relatively low temperature to provide the bottom rounded corners. A second thermal oxidation step is also carried out using oxygen ($O_2$) at a low flow rate but at a higher temperature to provide the rounded top corners, while maintaining an essentially conformal oxide in the trenches. This two-step thermal oxidation process which provides a conformal trench liner oxide improves the gap filling capabilities for the chemical vapor deposited (CVD)

oxide such as SA-CVD oxide or high-density-plasma (HDP) deposited oxides, while the top rounded corners reduce the junction leakage current. The trench isolation is now completed by depositing a CVD insulating layer. The insulating layer is deposited sufficiently thick to fill the trenches, and is etched back or chemical/mechanically polished (CMP) back to the silicon nitride layer to complete the isolation trenches essentially planar with the substrate surface. The silicon nitride can now be selectively removed in a hot phosphoric acid for continuing the process of making the semiconductor devices in and on the device areas.

BRIEF DESCRIPTION OF THE DRAWINGS

The objects and other advantages of this invention are best understood in the preferred embodiment with reference to the attached drawings that include.

DESCRIPTION OF THE PREFERRED EMBODIMENT

The method of this invention is now described in detail for forming trench isolation having a conformal liner oxide and also having rounded top and bottom corners in the silicon trench. The conformal liner oxide improves the CVD oxide gap filling in these submicron trenches, and the rounded corners improve the electrical characteristics of the device. Although only a portion of the substrate is depicted in the Figs. showing the formation of only one trench isolation region, it should be well understood by one skilled in the art that a multitude of trench isolation regions can be formed concurrently on a silicon substrate, and more particularly the improved trench isolation regions can be formed on silicon substrates having both P and N wells in and on which both N-channel and P-channel field effect transistors (FETs) and other devices can be built, such as CMOS.

Figure 1:
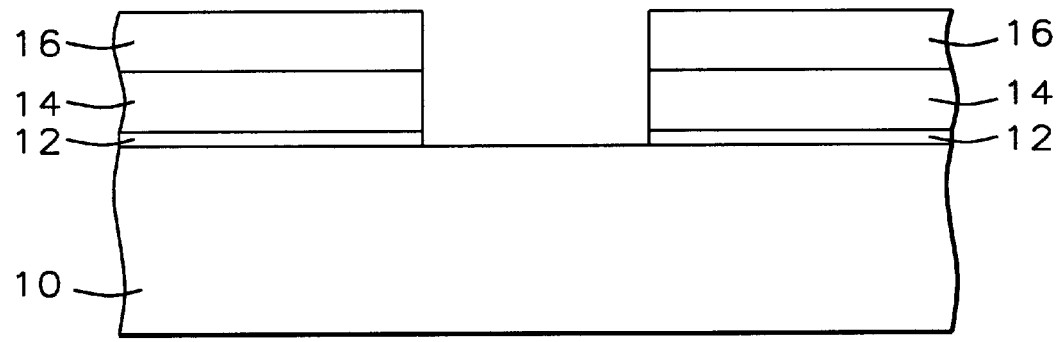
FIGS. 1 through 4 are schematic cross-sectional views showing depicting the sequence of process steps on a portion of a substrate having trench isolation with an improved conformal oxide liner.

Referring now to FIG. 1, the method for forming the trench isolation starts by forming a stress-release pad oxide 12 on a single-crystal silicon substrate 10. The pad oxide layer 12 is formed by thermally oxidizing the substrate in a dry or wet oxygen ambient at a temperature of between about 850 and 950° C. for about 30 to 120 minutes. The preferred thickness of the pad oxide is between about 50 and 200 Angstroms.

A silicon nitride layer 14 is then deposited on the pad oxide 12 to form an oxidation barrier layer over the device areas when a liner oxide is formed. The silicon nitride layer 14 is deposited by chemical vapor deposition (CVD) using, for example, a reactant gas mixture of silane ($SiH_4$) and ammonia ($NH_3$), and preferably is deposited to a thickness of between about 1000 and 2000 Angstroms.

Referring still to FIG. 1, a photoresist mask 16 is used to pattern the silicon nitride layer 14 and the pad oxide layer 12. Layer 14 is patterned to leave portions of the silicon nitride layer over device areas on the substrate 10, while exposing the substrate where the trench isolation is desired. The silicon nitride layer 14 is patterned using anisotropic plasma etching in a reactive ion etcher (RIE) or a high-density plasma (HDP) etcher and using a etchant gas such as trifluoromethane ($CHF_3$).

Figure 2:
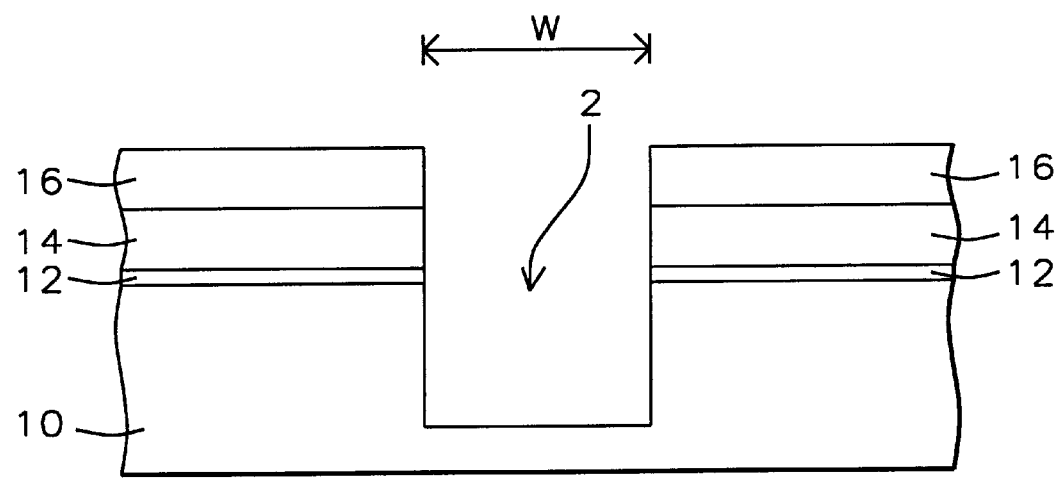

Referring now to FIG. 2, the photoresist mask 16 is also used for etching silicon trenches 2, having deep submicron widths W and essentially vertical sidewalls, in the substrate 10. As will be seen later, the conformal liner oxide allows one to more effectively fill the trench with a CVD oxide. Preferably the trenches are etched using a HD etcher or RIE and an etchant such as hydrogen bromide (HBr), chlorine ($Cl_2$), or carbon tetrafluoride ($CF_4$). The trenches 2 are preferably etched to a depth of between about 3000 and 4000 Angstroms. The photoresist mask 16 is then removed, for example by plasma ashing in oxygen ($O_2$). Alternatively, the photoresist mask 16 can be removed using a Caro's strip composed of equal parts of concentrated sulfuric acid ($H_2SO_4$) and a 30%-hydrogen peroxide ($H_2O_2$) solution.

Figure 3:
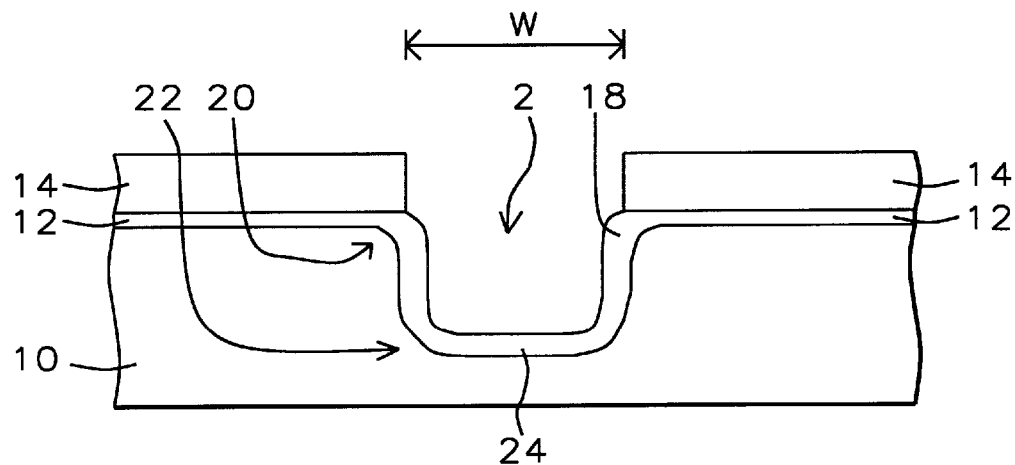

Referring to FIG. 3 and by the method of this invention, a two-step thermal oxidation process is carried out to form a conformal liner oxide 18 in the trenches 2, and to provide rounded top corners 20 and bottom corners 22 in the trenches. The first thermal oxidation step is done using oxygen ($O_2$) at a low flow rate and at a relatively low temperature to provide the bottom rounded corners. Preferably the first thermal oxidations is carried out in a thermal oxidation furnace, such as manufactured by K E Company of Japan. The first thermal oxidation is a dry oxidation carried out at a preferred $O_2$ flow rate of between about 0.1 and 0.5 liters per minute (L/min.), and at a temperature of between about 800 and 920° C., and more specifically at a temperature of 920° C. This first oxidation step results in a rounded bottom corner in the trench 2, as depicted by 22 in FIG. 3. A second thermal oxidation step is then carried out sequentially and in the same oxidation furnace. The preferred oxidation is also a dry oxidation using a low $O_2$ flow rate. For example, the preferred flow rate is between about 0.1 and 0.5 liters per minute, and at a higher temperature of between about 1000 and 1150° C. This oxidation step results in improved rounded top corners 20 in the trench 2, as also depicted in FIG. 3. The two-step process also provides an essentially conformal oxide 18 in the trenches, which is desirable for improving gap filling with a CVD oxide in trenches 2 having deep submicron widths W.

Figure 4:
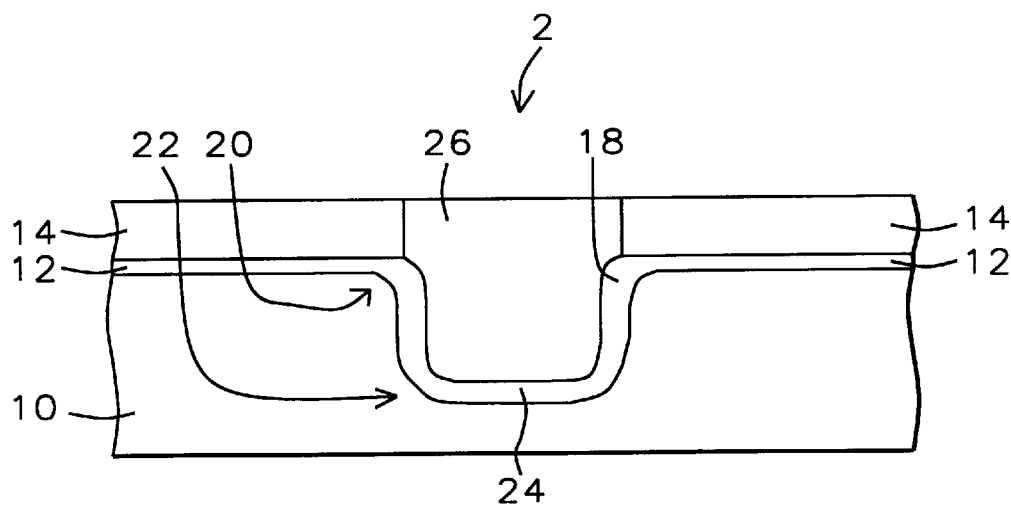

Referring next to FIG. 4, the trench isolation is now completed by depositing a CVD insulating layer 26 and chemical/mechanically polished (CMP) back to the silicon nitride layer 14 to complete the trench isolation. The CVD insulating layer is preferably a silicon oxide and is deposited using, for example, as the reactant gases silane ($SiH_4$) and oxygen ($O_2$). Alternatively, the CVD oxide can be deposited using tetraethosiloxane (TEOS) or TEOS/ozone as the reactant gas. The CVD oxide layer 26 is deposited to a thickness sufficient to fill the trench 2. For example, the CVD oxide would be deposited to a thickness higher than the top surface of the trench to fill the trench. Next the CVD oxide layer 26 is chemical/mechanically polished to the silicon nitride layer 24 to complete the trench isolation. Alternatively, the CVD oxide layer 26 can be plasma etched back using etch-back techniques. Although not shown in FIG. 4, the silicon nitride layer 14 is then selectively removed in a hot phosphoric acid over the device areas on and in which the semiconductor devices are fabricated.

To better appreciate the invention for making this conformal liner oxide and for making trenches with rounded top and bottom corners in the trenches, an EXAMPLE is provided.

EXAMPLE

The method involved forming trenches in a silicon substrate. The trenches were then oxidized using the two-step oxidation process of this invention detailed above to form the essentially conformal liner oxide, as schematically depicted in FIG. 3. A delineating polysilicon layer, which is not part of the process for making the isolation trenches, was deposited to delineate the liner oxide, and the substrate was then cleaved essentially vertical through the trench along one of the silicon substrate crystallo-graphic axes. The liner oxide was recessed by selectively etching the cleaved surface of the sample in a hydrofluoric (HF) acid, while the silicon trench and the delineating polysilicon layer remained essentially unetched. A thin gold layer was deposited to prevent electrostatic charging, and a scanning electron microscope (SEM) was then used to view and measure the thicknesses of the liner oxide along the trench.

The pad oxide 12, shown in FIG. 3, was thermally grown to a thickness between 50 and 150 Angstroms. The $Si_3N_4$ 14 was then deposited to a thickness between 1000 and 2000 Angstroms. The $Si_3N_4$ layer was then patterned, and the trenches 2 were etched to a depth between 0.3 and 0.4 microns. The first thermal oxidation step was performed at a temperature between 850 and 920° C., and an $O_2$ flow rate of between 0.1 and 0.5 liters per minute, and the second thermal oxidation was done at a temperature between 1000 and 1100° C. and at an $O_2$ flow rate of between 0.1 and 0.5 liters per minute. The thickness of the liner oxide was then measured from the SEM pictures along the trench. As depicted in FIG. 3, the thickness of the liner oxide at the bottom 24 of the trench 2 was measured to be 198 Angstroms, while the thickness of the liner oxide 18 on the sidewalls was about 250 and 300 Angstroms. Further, the thickness of the liner oxide at the bottom corners 22 was about 163 Angstroms, and was measured at the top corners 20 at 198 Angstroms. As clearly seen, a relatively thin liner oxide is formed by this two-step process and is quite conformal and uniform in thickness. This allows improved gap filling capabilities in these deep submicron wide trenches. Also, the top and bottom rounded corners reduce the junction leakage current.

While the invention has been particularly shown and described with reference to the preferred embodiment thereof, it will be understood by those skilled in the art that various changes in form and details may be made without departing from the spirit and scope of the invention.

What is claimed is:

1. A method for forming a trench isolation having a conformal trench liner oxide with rounded top and bottom corners for integrated circuits comprising the steps of:

providing a silicon substrate;

forming a pad oxide layer on said substrate;

depositing an oxidation barrier layer on said pad oxide;

patterning by photoresist masking and anisotropic etching said oxidation barrier layer and said pad oxide layer leaving portions over device areas while providing openings in said oxidation barrier layer for said trench isolation;

etching trenches in said silicon substrate exposed in said openings of said oxidation barrier layer;

thermally oxidizing said silicon substrate in said trenches thereby forming said liner oxide, wherein said thermal oxidation is carried out in a first and second thermal oxidation step done consecutively at two different temperatures to provide said conformal trench liner oxide having said rounded top and bottom corners in said trenches, wherein said first thermal oxidation step provides said bottom rounded corners in said trenches, and said second thermal oxidation step provides said top rounded corners in said trenches;

depositing an insulating layer sufficiently thick to fill said trenches;

planarizing said insulating layer to said oxidation barrier layer and completing said trench isolation.

2. The method of claim 1, wherein said pad oxide layer is formed by thermal oxidation having a thickness of between about 50 and 150 Angstroms.

3. The method of claim 1, wherein said oxidation barrier layer is silicon nitride, deposited by chemical vapor deposition to a thickness of between about 1000 and 2000 Angstroms.

4. The method of claim 1, wherein said trenches are anisotropically plasma etched to form vertical sidewalls and are etched to a depth of between about 3000 and 4000 Angstroms.

5. The method of claim 1, wherein said first thermal oxidation step is carried out using oxygen ($O_2$) at a low flow rate of between about 100 and 500 standard cubic centimeters per minute (sccm) and at a temperature of between about 850 and 920° C.

6. The method of claim 1, wherein said second thermal oxidation step is carried out using oxygen ($O_2$) at a low flow rate of between about 100 and 500 standard cubic centimeters per minute (sccm) and at a higher temperature of between about 1000 and 1150° C.

7. The method of claim 1, wherein said conformal trench liner oxide is grown to a thickness of between about 100 and 250 Angstroms during said first thermal oxidation step, and to a final thickness of between about 200 and 350 Angstroms after said second thermal oxidation step.

8. The method of claim 1, wherein said insulating layer is a silicon oxide deposited by chemical vapor deposition (CVD) using a reactant gas of tetraethosiloxane (TEOS).

9. The method of claim 1, wherein said insulating layer is a silicon oxide deposited by high-density plasma (HDP) deposition using a reactant gas of tetraethosiloxane (TEOS).

10. The method of claim 1, wherein said insulating layer is planarized by chemical/mechanical polishing.

11. A method for forming a trench isolation having a conformal trench liner oxide with rounded top and bottom corners for integrated circuits comprising the steps of:

providing a silicon substrate;

forming a pad oxide layer on said substrate;

depositing an oxidation barrier layer on said pad oxide, wherein said oxidation barrier layer is silicon nitride;

patterning by photoresist masking and anisotropic etching said oxidation barrier layer and said pad oxide layer leaving portions over device areas while providing openings in said oxidation barrier layer for said trench isolation;

etching trenches in said silicon substrate exposed in said openings of said oxidation barrier layer;

thermally oxidizing said silicon substrate in said trenches thereby forming said liner oxide, wherein said thermal oxidation is carried out in a first and second oxidation step done consecutively at two different temperatures to provide said conformal trench liner oxide having said rounded top and bottom corners in said trenches, wherein said first thermal oxidation step provides said bottom rounded corners in said trenches, and said second thermal oxidation step provides said top rounded corners in said trenches;

depositing an insulating layer sufficiently thick to fill said trenches;

planarizing said insulating layer to said oxidation barrier layer and completing said trench isolation.

12. The method of claim 11, wherein said pad oxide layer is formed by thermal oxidation having a thickness of between about 50 and 150 Angstroms.

13. The method of claim 11, wherein said oxidation barrier layer is deposited by chemical vapor deposition to a thickness of between about 1000 and 2000 Angstroms.

14. The method of claim 11, wherein said trenches are anisotropically plasma etched to form vertical sidewalls and are etched to a depth of between about 3000 and 4000 Angstroms.

15. The method of claim 11, wherein said first thermal oxidation step is carried out using oxygen ($O_2$) at a low flow rate of between about 100 and 500 standard cubic centimeters per minute (sccm) and at a temperature of between about 850 and 920° C.

16. The method of claim 11, wherein said second thermal oxidation step is carried out using oxygen ($O_2$) at a low flow rate of between about 100 and 500 standard cubic centimeters per minute (sccm) and at a higher temperature of between about 1000 and 1150° C.

17. The method of claim 11, wherein said conformal trench liner oxide is grown to a thickness of between about 100 and 250 Angstroms during said first thermal oxidation step, and to a final thickness of between about 200 and 350 Angstroms after said second thermal oxidation step.

18. The method of claim 11, wherein said insulating layer is a silicon oxide deposited by chemical vapor deposition (CVD) using a reactant gas of tetraethosiloxane (TEOS).

19. The method of claim 11, wherein said insulating layer is a silicon oxide deposited by high-density plasma (HDP) deposition using a reactant gas of tetraethosiloxane (TEOS).

20. The method of claim 11, wherein said insulating layer is planarized by chemical/mechanical polishing.

* * * * *